(12) United States Patent
Otremba

(10) Patent No.: US 8,299,585 B2
(45) Date of Patent: Oct. 30, 2012

(54) POWER SEMICONDUCTOR DEVICE

(75) Inventor: Ralf Otremba, Kaufbeuren (DE)

(73) Assignee: Infineon Technologies AG, Neubiberg (DE)

( * ) Notice: Subject to any disclaimer, the term of this patent is extended or adjusted under 35 U.S.C. 154(b) by 485 days.

(21) Appl. No.: 11/568,885

(22) PCT Filed: May 4, 2005

(86) PCT No.: PCT/DE2005/000848
§ 371 (c)(1),
(2), (4) Date: Oct. 6, 2008

(87) PCT Pub. No.: WO2005/112117
PCT Pub. Date: Nov. 24, 2005

(65) Prior Publication Data
US 2009/0045446 A1    Feb. 19, 2009

(30) Foreign Application Priority Data

May 11, 2004   (DE) .................. 10 2004 023 307

(51) Int. Cl.
*H01L 29/94* (2006.01)
(52) U.S. Cl. ........ 257/656; 257/685; 257/686; 257/690; 257/692; 257/693; 257/777; 257/E25.006; 257/E25.013; 257/E25.018; 257/E25.027; 257/E23.085
(58) Field of Classification Search .................. 257/685, 257/686, 690, 691, 692, 728, 693, 777, E25.006, 257/E25.013, E25.018, E25.027, E23.085; 438/108, 109
See application file for complete search history.

(56) References Cited

U.S. PATENT DOCUMENTS 6,277,225 B1 *  8/2001  Kinsman et al. ............. 156/196

FOREIGN PATENT DOCUMENTS

| JP | 503082 |   | 1/1975 |
|----|--------|---|--------|
| JP | 61108154 A | * | 5/1986 |
| JP | 02271655 |   | 11/1990 |
| JP | 07147379 |   | 6/1995 |
| JP | 07094674 |   | 4/1996 |
| JP | 10012811 A | * | 1/1998 |
| JP | 2003347509 |   | 12/2003 |

OTHER PUBLICATIONS

Office Action for corresponding JP Patent Application No. 2007-511853 dated Jun. 16, 2009 (7 pages).

* cited by examiner

*Primary Examiner* — Matthew Reames
*Assistant Examiner* — Ermias Woldegeorgis
(74) *Attorney, Agent, or Firm* — Dicke, Billig & Czaja, PLLC

(57) ABSTRACT

A power semiconductor device having a first active semiconductor component and a second active semiconductor component, the electrical connections of which are routed out of the semiconductor components in the form of connecting legs is disclosed. In one embodiment, the first semiconductor component is at least partially electrically connected to the second semiconductor component by means of a plug-in connection. The plug-in connection is realized by virtue of the connecting legs of the second semiconductor component engaging in the electrical connections of the first semiconductor component.

16 Claims, 5 Drawing Sheets

POWER SEMICONDUCTOR DEVICE

CROSS REFERENCE TO RELATED APPLICATION

This Utility Patent Application claims the benefit of the filing date of German Application No. 10 2004 023 307.1, filed May 11, 2004, and International Application No. PCT/DE2005/000848, filed May 4, 2005, both of which are herein incorporated by reference.

BACKGROUND

The invention relates to a power semiconductor device.

In order to save costs when fabricating power semiconductor devices, an attempt is made to achieve the highest possible integration densities. The disadvantage of this is that high integration densities make it more difficult to contact-connect the individual components of the power semiconductor device.

There are a plurality of approaches to increasing the integration density: the document DE 101 34 986 A1 thus teaches the use of adapter modules. The documents DE 199 23 523 A1 and DE 101 23 869 A1 demonstrate possible ways of increasing the integration density of the electronic devices themselves. Furthermore, DE 198 33 713 C1 discloses the practice of arranging electronic components above one another using special connecting technologies. DE 199 33 265 A1 describes the practice of arranging electronic components above one another using composite bodies.

For these and other reasons, there is a need for the present invention.

SUMMARY

One embodiment of the invention is based is to enable high integration densities in power semiconductor devices whilst simultaneously contact-connecting the components of the power semiconductor device in a reliable manner.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
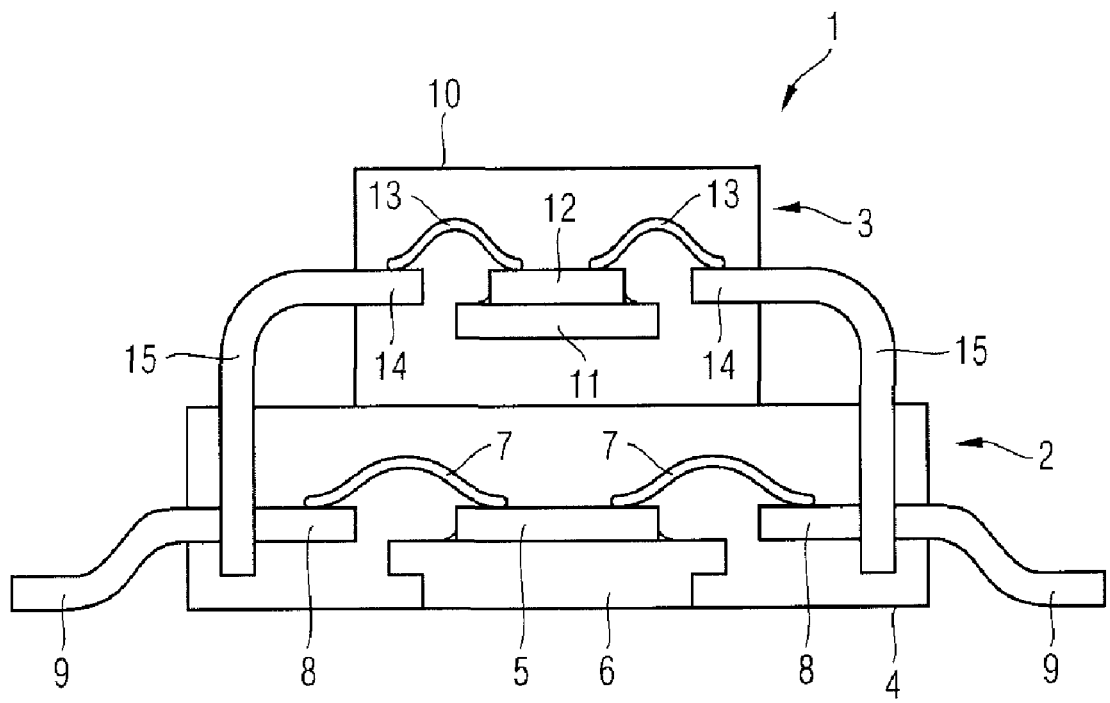
FIG. 1 illustrates a cross-sectional illustration of a first embodiment of a power semiconductor device according to the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment provides a power semiconductor device has a first active semiconductor component and a second active semiconductor component. Each semiconductor component is provided with electrical connections which are routed out of the semiconductor components in the form of connecting legs. The first semiconductor component is at least partially electrically connected to the second semiconductor component by means of a plug-in connection. The plug-in connection is realized by virtue of the connecting legs of the second semiconductor component engaging in the electrical connections of the first semiconductor component.

The term "active semiconductor component" is understood as meaning, in particular, controlling components such as transistors but also integrated circuits or chips. The active semiconductor components preferably represent power semiconductor components.

The connecting legs of the second semiconductor component preferably engage in the connecting legs of the first semiconductor component. To this end, in one embodiment, the (at least one connecting leg) connecting legs of the second semiconductor component respectively have (has) a groove and the (at least one connecting leg) connecting legs of the first semiconductor component respectively have (has) a bore. The dimensions of the groove and bore are matched to one another in such a manner that, when the connecting legs of the second semiconductor component are inserted into the respective bores in the connecting legs of the first semiconductor component, the connecting legs latch to one another. This makes it possible to realize equally reliable and large-scale integrated contact-connection.

The second semiconductor component is arranged, for example, above the first semiconductor component but may also be arranged beside the first semiconductor component.

The invention is not restricted to a power semiconductor device having only two active semiconductor components. Rather, the number of active semiconductor components can be arbitrary. For example, if the second semiconductor component is arranged above the first semiconductor component, further semiconductor components can be arranged above the second semiconductor component, the connecting legs of which further components each engage in the connecting legs of the semiconductor component lying beneath them. This makes it possible to realize any desired complex layer structures having active semiconductor components.

The power semiconductor device according to the invention may have passive components whose electrical connections or connecting legs are electrically connected to electrical connections or connecting legs of the active semiconductor components via plug-in connections. In other words: the principle of the plug-in connection according to the invention can also be applied to power semiconductor devices which, in addition to active semiconductor components, also have passive components, for example capacitors or resistors. This makes it possible to construct power semiconductor devices having any desired number of active and passive components which are electrically connected to one another by means of plug-in connections.

As already indicated, it is, in principle, possible for the plug-in connections to be situated inside one of the active semiconductor components or inside one of the passive components and/or outside the active semiconductor components or the passive components.

The electrical connections and/or the connecting legs of the active semiconductor elements or of the passive components may be configured in such a manner that electrical contacts, which are resilient contacts, press contacts, clamping contacts or the like, are formed by the plug-in connections. By virtue of a loop-shaped form of connecting legs, for example, the connecting leg can thus exert a laterally directed force on the electrical connection/connecting leg and can thus form a press/clamping contact when the connecting leg is inserted into a further connecting leg or an electrical connection.

Therefore, the power semiconductor device according to the invention makes it possible to reduce the number of conductor tracks on printed circuit boards and substrates. Furthermore, line-induced losses and interference are reduced. A fundamental aspect of the invention is to use already existing components of electronic devices for plug-in connections or as rewiring planes. This makes it possible to dispense with additional modules and conductor tracks.

A first embodiment 1 illustrated in FIG. 1 has a first active semiconductor component 2 and a second active semiconductor component 3 which is arranged above the first active semiconductor component 2.

The first active semiconductor component 2 has a housing 4 in which a semiconductor component 5 is provided on a carrier element 6. The semiconductor component 5 is contact-connected by means of contact elements 7 which are in turn connected to electrical connections 8. The electrical connections 8 are routed out of the housing 5 in the form of connecting legs 9.

In an analogous manner to this, the second active semiconductor component 3 has a housing 10 in which a carrier element 11 and a semiconductor component 12, which is provided on the latter, are arranged. The semiconductor component 12 is contact-connected by means of contact elements 13 which are in turn connected to electrical connections 14. The electrical connections 14 are routed out of the housing 10 in the form of connecting legs 15, are inserted into the housing 4 of the first active semiconductor component 2 via corresponding bores and engage in the electrical connections 8, with the result that an electrical connection is produced between the ends of the connecting legs 15 and the electrical connections 8. Device components of the first active semiconductor component 2 (the electrical connections 8) are thus used to contact-connect the second active semiconductor component 3. This makes it possible, on the one hand, to increase the integration density and, on the other hand, reduces line-induced losses and interference.

Figure 2:
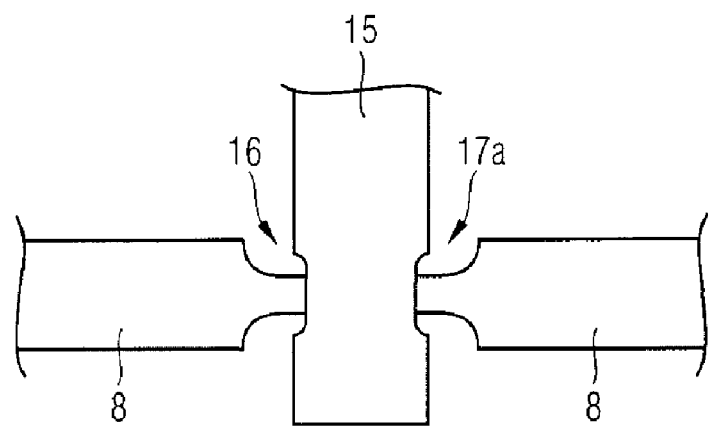
FIG. 2 illustrates one embodiment of the plug-in connection illustrated in FIG. 1.

The connecting section in which the ends of the connecting legs 15 engage in the electrical connections 14 is implemented in the form of a plug-in connection, one embodiment of this plug-in connection being able to be seen in FIG. 2. In this embodiment, each electrical connection 8 has a bore 16 through which the ends of the connecting legs 15 can be passed. Furthermore, a groove 17 which can engage in the profile of the bores 16 and thus forms a stable plug-in connection between the active semiconductor components 2, 3 is provided at the ends of the connecting legs 15.

In one embodiment, the second active semiconductor component 3 is a control chip (IC) and the first active semiconductor component 2 is a power semiconductor component, for example a power transistor.

Figure 3:
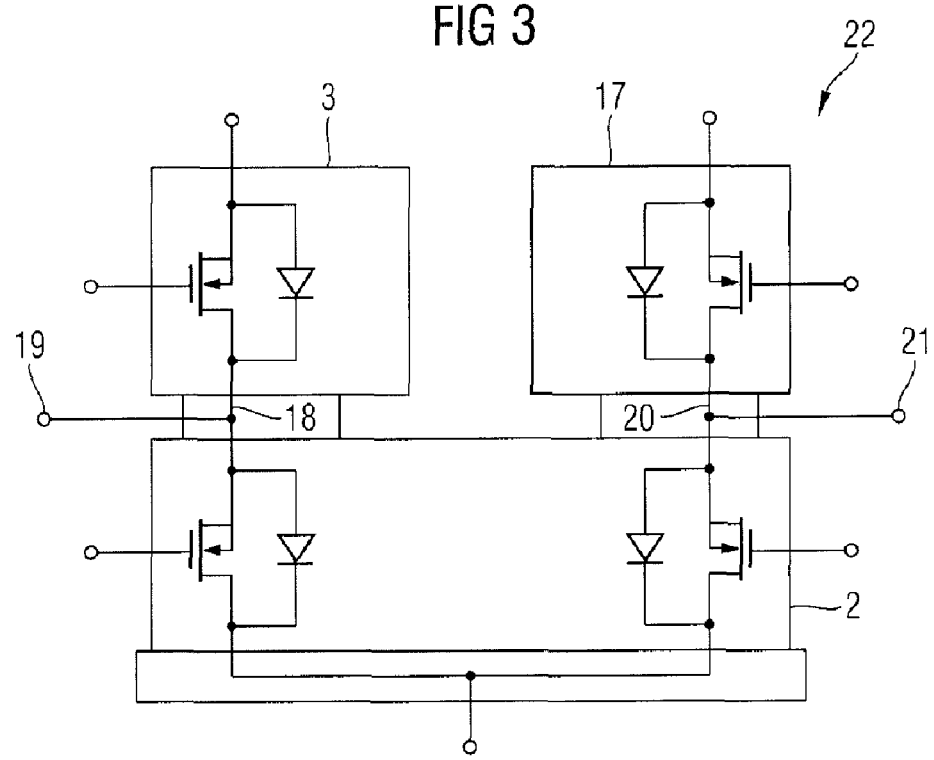
FIG. 3 illustrates a schematic illustration of an application example of the power semiconductor device according to the invention.

In FIG. 3, a first to a third active semiconductor component 2, 3 and 17 are connected to one another to form a power semiconductor device 22 (a bridge circuit). The invention can be applied to the power semiconductor device 22 in two ways:

On the one hand, a connecting leg 18, which is routed out of the second active semiconductor component 3, can be electrically connected to a connecting leg 19, which is routed out of the first active semiconductor component 2, on the basis of a plug-in connection; in a manner similar to this, a connecting leg 20, which is routed out of the third active semiconductor component 17, can be electrically connected to a connecting leg 21, which is routed out of the first active semiconductor component 2, on the basis of a plug-in connection. The plug-in connection according to the invention makes it possible to connect the active semiconductor components 2, 3 and 17 together in an equally simple, reliable and large-scale integrated manner. The power semiconductor device illustrated in FIG. 3 is used, for example, to connect electric motors or switched-mode power supplies, the individual components in turn being able to be controlled or regulated via individual ICs or a plurality of ICs.

On the other hand, additional semiconductor components may be plugged onto the power semiconductor device 22 by means of a plug-in connection. This is demonstrated, by way of example, using FIG. 4.

Figure 4:
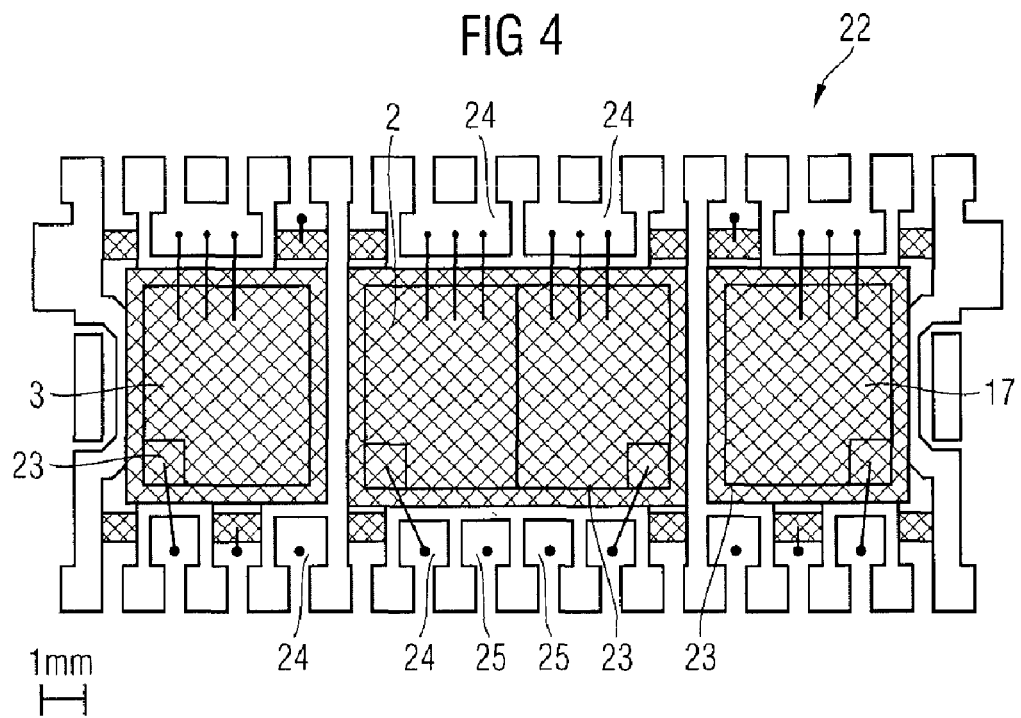
FIG. 4 illustrates one possible bonding diagram for the power semiconductor device illustrated in FIG. 3.

FIG. 4 depicts one possible bonding diagram for the power semiconductor device 22 illustrated in FIG. 3. In this embodiment, some of the contact areas 24 are not needed to contact-connect the power semiconductor device 22, for example the contact areas labeled using reference symbol 25. According to the invention, the contact areas 25 can therefore be used to contact-connect an active semiconductor component (for example a control chip or another semiconductor power component) (not illustrated here) which is arranged above the contact areas. For example, bores through which connecting legs of the active semiconductor component, which is arranged above, can be inserted in order to form an electrical connection to the contact areas 25 may be provided in the contact areas 25. This makes it possible to use conductor tracks of the power semiconductor device 22 which are present anyway but are not needed to contact-connect the latter, and in this manner to save space, to increase the integration density and to achieve a gain in electrical performance.

Figure 5:
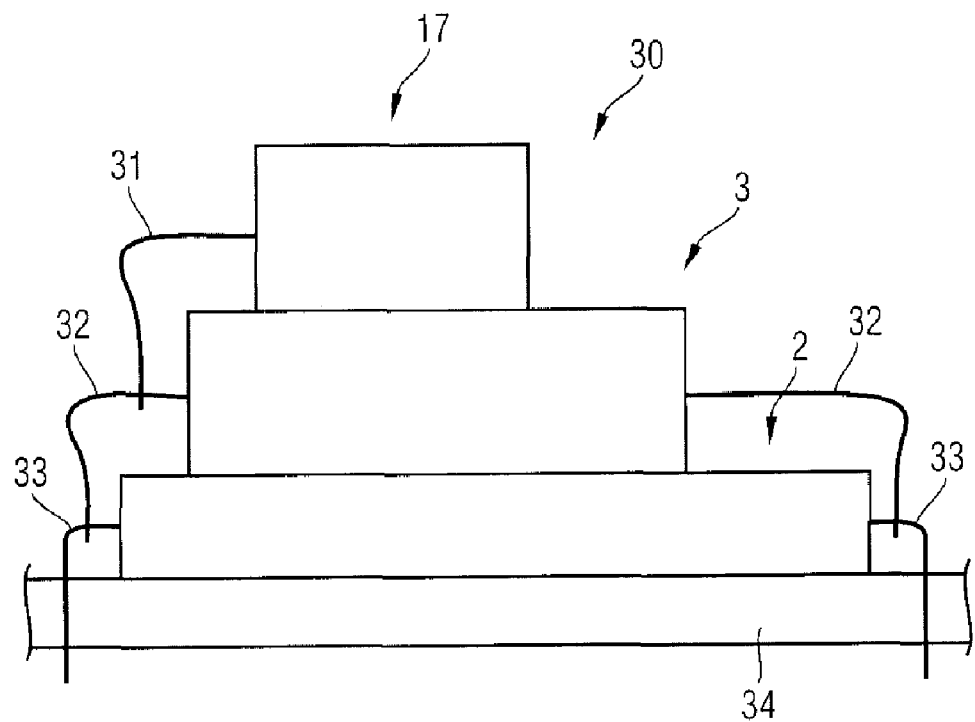
FIG. 5 illustrates a cross-sectional illustration of a second embodiment of a power semiconductor device according to the invention.

FIG. 5 illustrates a second embodiment 30 of a power semiconductor device according to the invention. In this embodiment, a first, a second and a third active semiconductor component 2, 3, 17 are stacked above one another, a connecting leg 31 of the third active semiconductor component 17 engaging, in the form of a plug-in connection, in a connecting leg 32 of the second active semiconductor component 3. Furthermore, the connecting legs 32 of the second active semiconductor component 3 engage, in the form of a plug-in connection, in the connecting legs 33 of the first active semiconductor component 2. Since the connecting legs of the upper active semiconductor components each engage in the connecting legs of the semiconductor component lying beneath them, only the connecting legs 33 thus have to be soldered to a printed circuit board 34.

As a result of the loop-shaped form of the connecting legs 31, 32, it is possible for the connecting leg 31 to exert a laterally directed force on the connecting leg 32 when the connecting leg 31 engages in the connecting leg 32. The same applies, in an analogous manner, to the engagement of the connecting legs 32 in the connecting legs 33. This thus makes it possible to achieve stable electrical clamping contact between the connecting legs 31, 32 and 33 in a simple manner. Generally speaking, the quality of the electrical contacts between the connecting legs can be optimized by means of a special geometry of the connecting legs 31 to 33.

Figure 6:
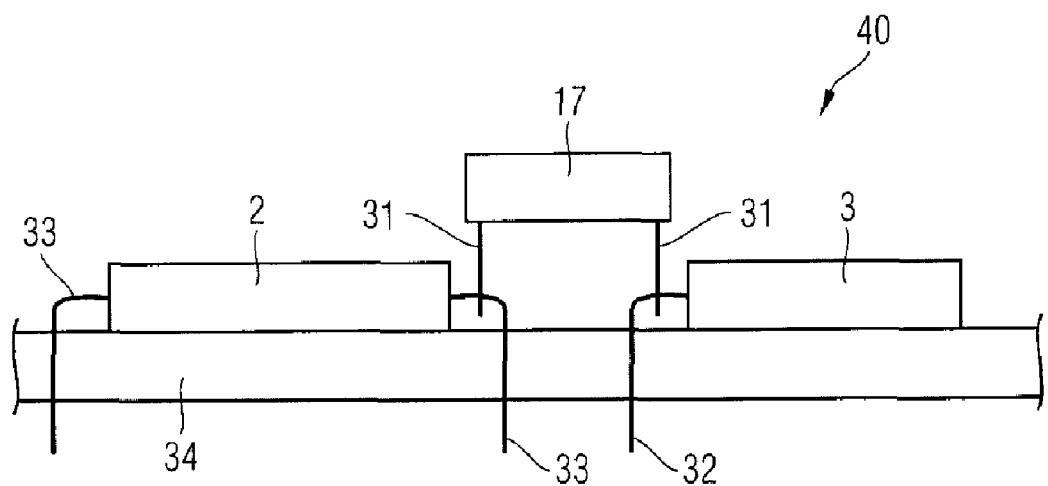
FIG. 6 illustrates a cross-sectional illustration of a third embodiment of a power semiconductor device according to the invention.

The third embodiment 40 illustrated in FIG. 6 illustrates a first, a second and a third active semiconductor component 2, 3 and 17, the first and second active semiconductor components 2, 3 being arranged beside one another and the third active semiconductor component 17 connecting the two semiconductor components 2, 3 by virtue of a connecting leg 31 of the third active semiconductor component 17 engaging in a connecting leg 33 of the first active semiconductor component 2 and another connecting leg 31 of the third active semiconductor component 17 engaging in a connecting leg 32 of the second active semiconductor component 3. The third active semiconductor component 17 is, for example, a control chip and the first and second active semiconductor components 2, 3 may be power elements, for example transistors. However, the invention is not restricted to this.

Figure 7:
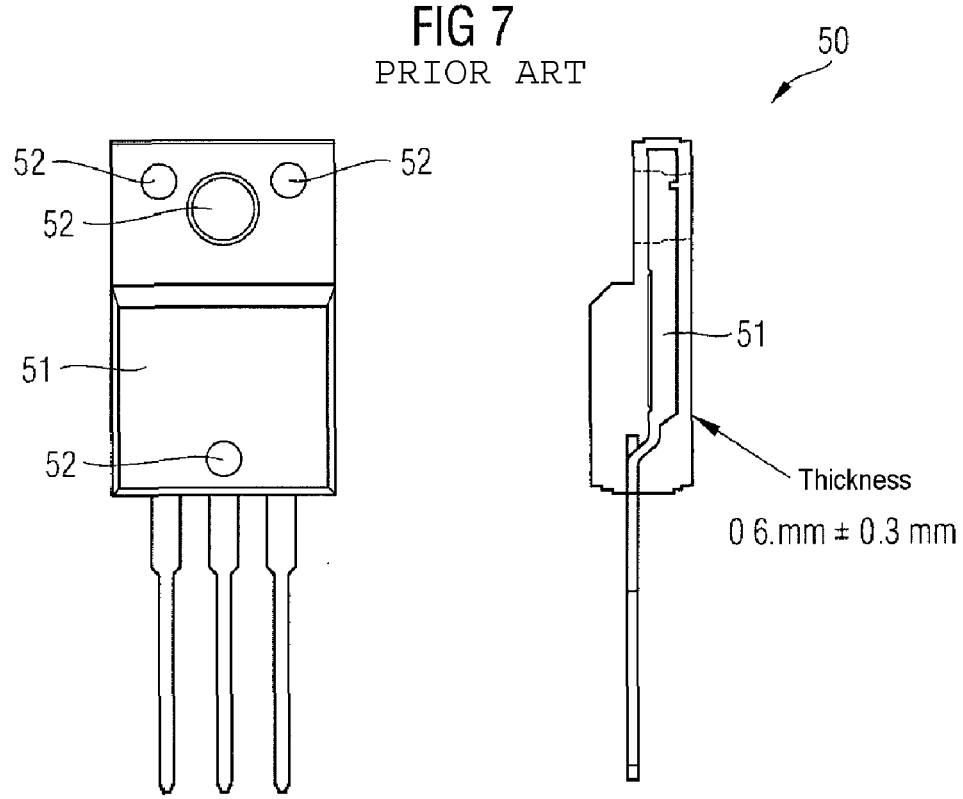
FIG. 7 illustrates a first power semiconductor device according to the prior art.
Figure 7:
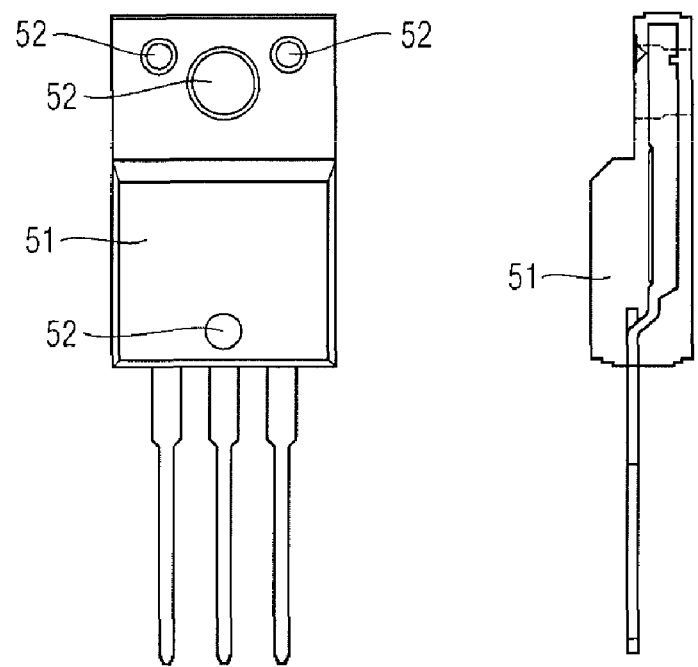

FIG. 7 illustrates an active semiconductor component 50 according to the prior art, bores 52 being made in the housing (molding composition and lead frame) 51 of the component. These bores are needed when mounting the semiconductor component 50, that is to say they are present anyway and can be used, according to the invention, to insert connecting legs of a semiconductor component (not illustrated here), which is arranged above them, into the housing 51 of the semiconductor component 50. This makes it possible for electrical connections (not illustrated here) which run through the bores 52 to be brought into contact with the connecting legs of the semiconductor component which is arranged above them. In this special case, there is thus no need to produce additional bores in order to realize a plug-in connection, as illustrated in FIG. 1, for example. When the housing 51 is used according to the invention, the bores 52 could also be arranged in other regions of the molding composition and of the lead frame or of the connecting legs.

Figure 8:
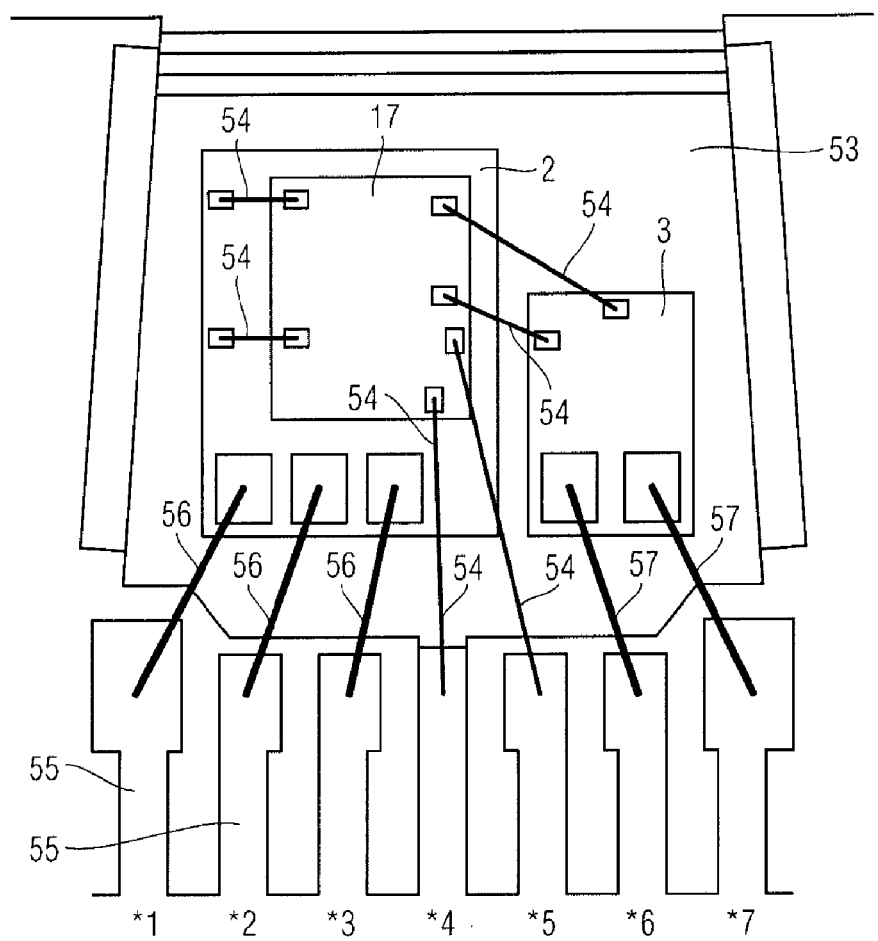
FIG. 8 illustrates a second power semiconductor device according to the prior art.

FIG. 8 illustrates a power semiconductor device according to the prior art. In this embodiment, a first, a second and a third active semiconductor component 2, 3, 17 are provided on a printed circuit board 53. In this case, the third active semiconductor component 17 is provided on the first active semiconductor component 2 and the second active semiconductor component 3 is arranged beside the first active semiconductor component 2. In this embodiment, the first and second active semiconductor components 2, 3 are power semiconductor elements and the third active semiconductor component 17 is a control chip. The semiconductor component 17 is connected to the first and second active semiconductor components 2, 3 and to contact areas 55 of the printed circuit board 53 by means of electrical connections 54. Furthermore, the first active semiconductor component 2 is connected to the contact areas 55 by means of electrical connections 56 and the second active semiconductor component 3 is connected to the contact areas 55 by means of electrical connections 57.

It can clearly be seen that the design rules for the active semiconductor components 2, 3 and 17 have to be intensively matched to one another, which has the disadvantage that the available space on the printed circuit board 53 can be used to only an insufficient extent. In addition, in this embodiment, the active semiconductor components 2, 3 cannot be driven by different control chips since, on account of the small dimensions of the second active semiconductor component 3, in particular, optional semiconductor components, for example control chips, often do not find space on the active semiconductor components 2, 3. These disadvantages can be avoided by the power semiconductor device according to the invention. As a result of already existing device components being used according to the invention, the geometric configuration of the control chip 17 is largely independent of the geometric configuration of the semiconductor components 2, 3, with the result that even semiconductor components which are larger than semiconductor components lying beneath them can be stacked on the latter.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

The invention claimed is:

1. A power semiconductor device comprising:
   a first active semiconductor component and a second active semiconductor component, the electrical connections of which are routed out of the semiconductor components in the form of connecting legs; and
   plug-in connections for at least partially connecting the first semiconductor component to the second semiconductor component, wherein the plug-in connections are provided by virtue of the connecting legs of the second semiconductor component engaging in the electrical connections of the first active semiconductor component,
   wherein at least one connecting leg of the second semiconductor component has a groove and at least one connecting leg of the first semiconductor component has a bore, the dimensions of the groove and of the bore being matched to one another in such a manner that, when the connecting leg of the second semiconductor component is inserted into the bore in the connecting leg of the first semiconductor component, the connecting legs latch to one another, and
   wherein in a direction perpendicular to the at least one connecting leg of the second semiconductor component, a width of the at least one connecting leg of the second semiconductor component at the groove where the connecting legs latch to one another is narrower than a width of the at least one connecting leg of the second semiconductor component at both ends of the groove.

2. The power semiconductor device as claimed in claim 1, comprising:
   wherein the connecting legs of the second semiconductor component engage in the connecting legs of the first semiconductor component.

3. The power semiconductor device as claimed in claim 1, comprising:
wherein the second semiconductor component is arranged above the first semiconductor component.

4. The power semiconductor device as claimed in claim 3, comprising:
wherein further semiconductor components are arranged above the second semiconductor component, the connecting legs of which components each engage in the connecting legs of the semiconductor component lying beneath them.

5. The power semiconductor device as claimed in claim 1, comprising:
wherein the second semiconductor component is arranged beside the first semiconductor component.

6. The power semiconductor device as claimed in claim 1, comprising:
wherein the power semiconductor device has passive components whose electrical connections or connecting legs are electrically connected to electrical connections or connecting legs of the active semiconductor components via plug-in connections.

7. The power semiconductor device as claimed in claim 1, comprising:
wherein the plug-in connections are situated inside one of the active semiconductor components or inside one of the passive components and/or outside the active semiconductor components or the passive components.

8. The power semiconductor device as claimed in claim 1, comprising:
wherein the electrical connections and/or the connecting legs of the active semiconductor components or of the passive components are configured in such a manner that electrical contacts, which are resilient contacts, press contacts, or clamping contacts are formed by the plug-in connections.

9. A power semiconductor device comprising:
a first active semiconductor component and a second active semiconductor component, the electrical connections of which are routed out of the semiconductor components in the form of connecting legs;
plug-in connections for at least partially connecting the first semiconductor component to the second semiconductor component, wherein the plug-in connections are provided by virtue of the connecting legs of the second semiconductor component engaging in the electrical connections of the first active semiconductor component; and
one or more passive semiconductor components having electrical connections to the first active semiconductor component via the plug-in connections,
wherein the connecting legs of the second semiconductor component engage in the connecting legs of the first semiconductor component,
wherein at least one connecting leg of the second semiconductor component has a groove and at least one connecting leg of the first semiconductor component has a bore, the dimensions of the groove and of the bore being matched to one another in such a manner that, when the connecting leg of the second semiconductor component is inserted into the bore in the connecting leg of the first semiconductor component, the connecting legs latch to one another, and
wherein in a direction perpendicular to the at least one connecting leg of the second semiconductor component, a width of the at least one connecting leg of the second semiconductor component at the groove where the connecting legs latch to one another is narrower than a width of the at least one connecting leg of the second semiconductor component at both ends of the groove.

10. The power semiconductor device as claimed in claim 1, wherein the passive semiconductor components includes capacitors or resistors.

11. The power semiconductor device as claimed in claim 9, comprising:
wherein the second semiconductor component is arranged above the first semiconductor component.

12. The power semiconductor device as claimed in claim 11, comprising:
wherein further semiconductor components are arranged above the second semiconductor component, the connecting legs of which components each engage in the connecting legs of the semiconductor component lying beneath them.

13. The power semiconductor device as claimed in claim 9, comprising:
wherein the second semiconductor component is arranged beside the first semiconductor component.

14. The power semiconductor device as claimed in claim 9, comprising:
wherein the power semiconductor device has passive components whose electrical connections or connecting legs are electrically connected to electrical connections or connecting legs of the active semiconductor components via plug-in connections.

15. The power semiconductor device as claimed in claim 9, comprising:
wherein the plug-in connections are situated inside one of the active semiconductor components or inside one of the passive components and/or outside the active semiconductor components or the passive components.

16. The power semiconductor device as claimed in claim 9, comprising:
wherein the electrical connections and/or the connecting legs of the active semiconductor components or of the passive components are configured in such a manner that electrical contacts, which are resilient contacts, press contacts, or clamping contacts are formed by the plug-in connections.

* * * * *